(12) United States Patent
Cok et al.

(10) Patent No.: US 9,374,894 B2
(45) Date of Patent: *Jun. 21, 2016

(54) IMPRINTED MICRO-WIRE RIB STRUCTURE

(71) Applicant: Eastman Kodak Company, Rochester, NY (US)

(72) Inventors: Ronald Steven Cok, Rochester, NY (US); Mitchell Stewart Burberry, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 63 days.

This patent is subject to a terminal disclaimer.

(21) Appl. No.: 14/476,005

(22) Filed: Sep. 3, 2014

(65) Prior Publication Data
US 2016/0066420 A1 Mar. 3, 2016

(51) Int. Cl.
*H05K 1/09* (2006.01)
*H05K 1/11* (2006.01)

(52) U.S. Cl.
CPC .............. *H05K 1/092* (2013.01); *H05K 1/111* (2013.01); *H05K 2201/0108* (2013.01)

(58) Field of Classification Search
CPC ............. H05K 1/02; H05K 3/12; H05K 3/46; H05K 3/125; H05K 3/467; H05K 3/1291; H01L 21/768; H01L 21/4763; H01L 23/538

USPC ........... 174/251, 253; 361/767; 427/79, 97.3, 427/97.4, 559; 257/773; 438/641; 216/13, 216/44; 156/219
See application file for complete search history.

(56) References Cited

U.S. PATENT DOCUMENTS

| | | |
|---|---|---|
| 6,645,444 B2 | 11/2003 | Goldstein |
| 8,179,381 B2 | 5/2012 | Frey et al. |
| 2006/0057502 A1 | 3/2006 | Okada et al. |
| 2010/0328248 A1 | 12/2010 | Mozdzyn |
| 2011/0007011 A1 | 1/2011 | Mozdzyn |

FOREIGN PATENT DOCUMENTS

CN 102063951 5/2011

*Primary Examiner* — Xiaoliang Chen
(74) *Attorney, Agent, or Firm* — J. Lanny Tucker

(57) ABSTRACT

A micro-wire rib structure includes a substrate and a cured layer formed on or over the substrate, the cured layer having a cured-layer surface. A micro-channel is imprinted in the cured layer, the micro-channel having a micro-channel depth, a micro-channel bottom, first and second micro-channel sides, and one or more ribs having opposing rib sides and a rib top defining a rib height less than the micro-channel depth. Each rib is located between the first and second micro-channel sides and extends from the micro-channel bottom toward the cured-layer surface. A cured electrical conductor forming a micro-wire is formed in the micro-channel. The micro-wire extends continuously from the first micro-channel side, over the micro-channel bottom, the rib side(s) and rib top(s) to the second micro-channel side forming a continuous electrical conductor from the first micro-channel side to the second micro-channel side.

19 Claims, 8 Drawing Sheets

IMPRINTED MICRO-WIRE RIB STRUCTURE

CROSS REFERENCE TO RELATED APPLICATIONS

Reference is made to commonly-assigned U.S. patent application Ser. No. 14/476,059 (now U.S. Pat. No. 9,161,456) filed Sep. 3, 2014, entitled Making Imprinted Micro-Wire Rib Structure by Cok; to commonly-assigned U.S. patent application Ser. No. 14/475,878, filed Sep. 3, 2014, entitled Ribbed Large-Format Imprinted Structure by Cok; to commonly-assigned U.S. patent application Ser. No. 13/784,866 filed Mar. 5, 2013 entitled Variable Depth Micro-Channel Structure by Cok; and to commonly-assigned U.S. patent application Ser. No. 13/784,869 filed Mar. 5, 2013 entitled Micro-Channel Structure with Variable Depths by Cok; the disclosures of which are incorporated herein.

FIELD OF THE INVENTION

The present invention relates to imprinted structures having micro-channels filled with cured electrically conductive materials.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass.

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Application Publication No. 2011/0007011 teaches a capacitive touch screen with a mesh electrode, as does U.S. Patent Application Publication No. 2010/0026664.

It is known in the prior art to form conductive traces including nano-particles, for example silver nano-particles. The synthesis of such metallic nano-crystals is known. U.S. Pat. No. 6,645,444 describes a process for forming metal nano-crystals optionally doped or alloyed with other metals. U.S. Patent Application Publication No. 2006/0057502 describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains.

More recently, transparent electrodes including very fine patterns of conductive micro-wires have been proposed. For example, capacitive touch-screens with mesh electrodes including very fine patterns of conductive elements, such as metal wires or conductive traces, are taught in U.S. Patent Application Publication No. 2010/0328248 and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between $0.5\mu$ and $4\mu$ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

Capacitive touch-screens with mesh electrodes including very fine patterns of conductive elements are used in portions of a substrate where transparency is important, for example in an area associated with a display. However, in other portions of a substrate, for example in a bezel area around the periphery of a substrate associated with display, transparency is not as important as electrical conductivity in a micro-wire electrically connecting display area electrodes to connection pads or electrical circuits. In such a peripheral area, very conductive electrical bus connections are useful.

However, it is difficult to imprint large areas, particularly with a high density of structures, and it is difficult to fill a large, imprinted area with a liquid such as a conductive ink that is subsequently cured. For example, the coffee-ring effect is widely known to compromise the uniformity of a dried coating because of capillary flow induced by differential evaporation rates over the extent of the coating. These difficulties limit the size and conductivity of imprinted micro-channels with cured conductive inks. In some applications, multiple micro-channels filled with cured conductive ink are electrically connected to provide improved conductivity.

However, such multiple micro-channels require more space on a substrate, limiting the substrate area that is used for other purposes. Because of such imprinting and drying problems, it is difficult to form large conductive micro-wires on a substrate using imprint-and-fill processes.

SUMMARY OF THE INVENTION

There is a need, therefore, for improved methods and materials for forming large-format imprinted structures filled with conductive materials that provide increased conductivity, reduced area, and simple manufacturing processes.

In accordance with the present invention, a micro-wire rib structure comprises:
a substrate;
a cured layer formed on or over the substrate, the cured layer having a cured-layer surface;
a micro-channel imprinted in the cured layer, the micro-channel having a micro-channel depth, a micro-channel bottom, first and second micro-channel sides, and one or more ribs having opposing rib sides and a rib top defining a rib height less than the micro-channel depth, each rib located between the first and second micro-channel sides and extending from the micro-channel bottom toward the cured-layer surface;
a cured electrical conductor forming a micro-wire in the micro-channel, the micro-wire extending continuously from the first micro-channel side, over the micro-channel bottom, the rib side(s) and rib top(s), to the second micro-channel side forming a continuous electrical conductor from the first micro-channel side to the second micro-channel side.

Structures and methods of the present invention provide larger and more conductive micro-wires using less space than alternative structures and methods of the prior art. The methods and structures decreases material requirements, increase manufacturing speed and simplicity, and require less equipment.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

Figure 1:
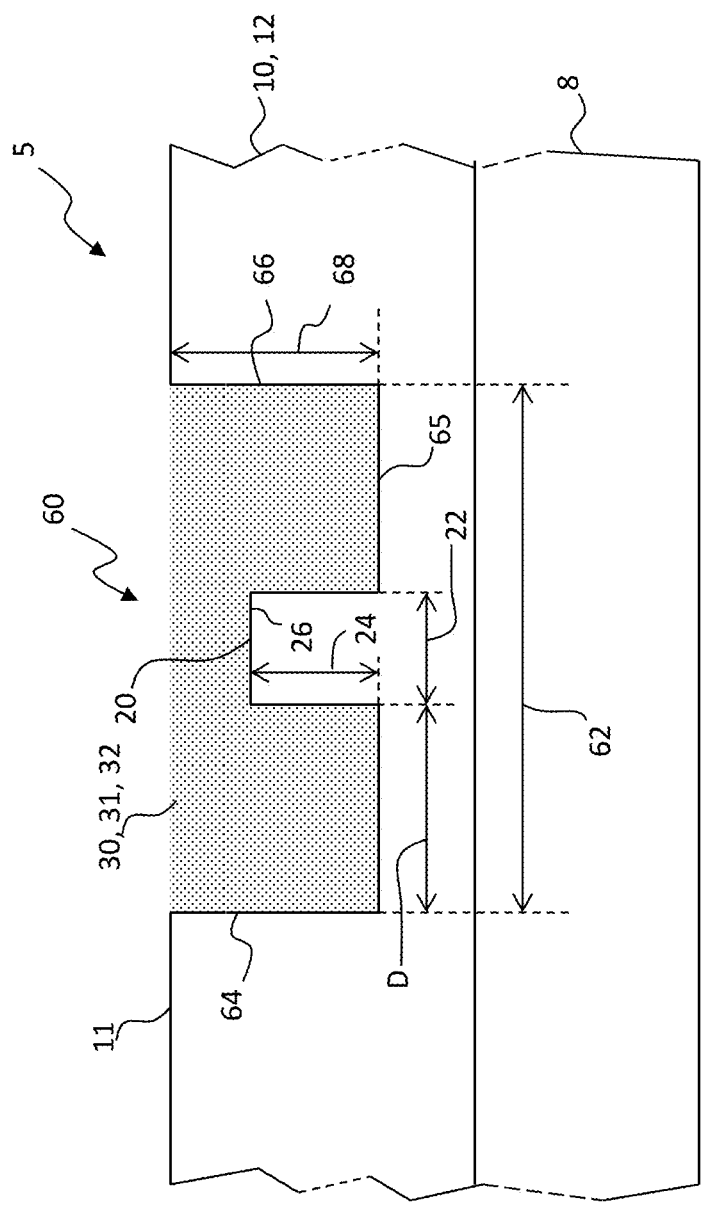
FIG. 1 is a cross-sectional view of a micro-wire rib structure in an embodiment of the present invention.

The Figures are not necessarily to scale, since the range of dimensions in the drawings is too great to permit depiction to scale.

DETAILED DESCRIPTION OF THE INVENTION

Substrates used in combination with displays, for example touch screens, typically have a display area in which transparency is important and a peripheral area used to connect electrodes in the display area to external or local electrical components in the peripheral area using electrical buses. For example, capacitive touch screens use spaced-apart electrically connected micro-wires to form electrodes in the display area. However, such micro-wires are limited in their current-carrying capacity so that they are not suitable as high-conductivity electrical buses for connecting connection pads or electrical components in the peripheral area to the electrodes in the display area. Either multiple such micro-wires are used, requiring additional substrate space in the peripheral area, or alternative conductive materials or processes must be used, requiring additional manufacturing steps and increasing costs. It is desirable to limit the size of the peripheral area to increase the display area and it is also desirable to reduce the number and variety of manufacturing steps.

It has been experimentally demonstrated that micro-wires formed by curing liquid curable inks coated into relatively wide (for example wider than 20 microns, 40 microns, or 60 microns) micro-channels can have a problematic shape and distribution. In some experimental examples, such wide micro-wires do not extend over the entire micro-channel bottom of a wide conventional micro-channel and can form separate conductors on either side and against the walls of a wide conventional micro-channel. Alternatively, wide micro-wires do not extend up to the surface of a cured layer in which the micro-channels are formed, inhibiting electrical connection to an electrical connector from the wide micro-wire. Moreover, it can be problematic to imprint wide micro-channels since the amount of imprinted volume in an area is too large relative to the total volume of the area.

Figure 8:
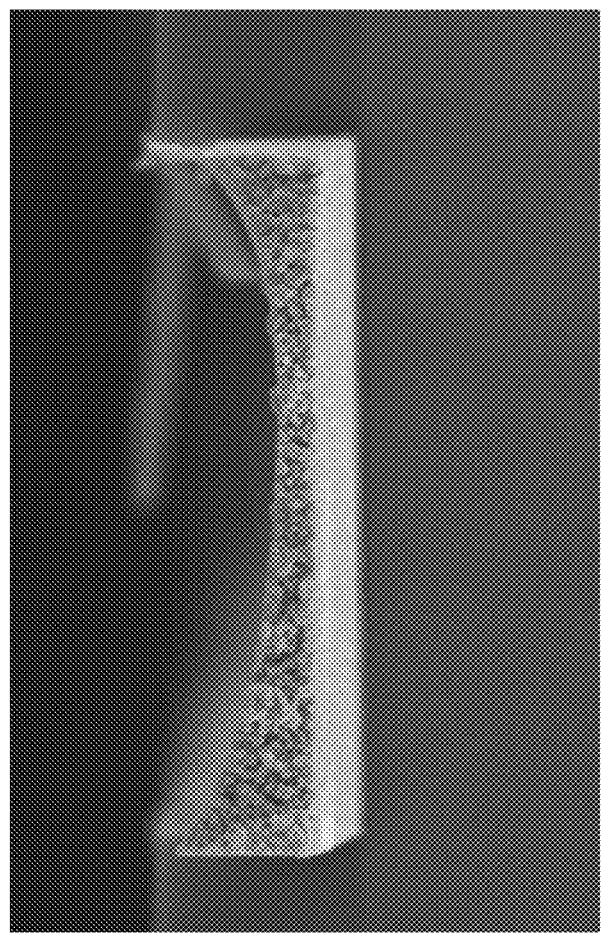
FIG. 8 is a representation illustrating a wide micro-cavity useful in understanding the present invention.

Referring to FIG. 8, it has been discovered through experimentation that materials dried within a large area, for example a wide conventional unstructured micro-channel having a width greater than 20 microns, does not dry evenly within the micro-channel. Furthermore, when a liquid material coated over the surface and wide conventional micro-channels of the cured layer is removed from the surface of the cured layer to leave the liquid material only in the wide conventional micro-channels, for example by wiping, if the wide conventional micro-channel is too wide the liquid material is also removed from the micro-channel by the wiping device. Even repeated coatings of the liquid material will not solve this wiping problem, since the coated liquid material is repeatedly removed from the wide conventional micro-channels with the wiper.

As is readily observed in FIG. 8, the dried material is thinner in the center than at the edges of the conventional micro-channel. As the conventional micro-channel increases in width, the center of the wide conventional micro-channel can become devoid of material, leaving material only at the sides of the wide conventional micro-channel. If the dried material is a conductive material, the conductivity of the wide conventional micro-channel is greatly reduced, at least in part because the wide conventional micro-channel is not filled.

According to various embodiments and methods of the present invention, a substrate includes wide structured micro-channels with ribs. The structured micro-channels are filled with cured conductive material forming wide structured micro-wires. The wide structured micro-wires provide improved conductivity in a smaller space than conventional micro-wires formed in conventional unstructured micro-channels without ribs or a plurality of such micro-wires spaced apart on a substrate. The ribs in the structured micro-channels provide additional surface area that enhances distribution of liquid curable conductive materials and prevents removal of the liquid curable conductive materials with wipers used to remove the liquid curable conductive materials from the surface of the substrate. Thus, the micro-channel ribs enable wide imprinted structured micro-channels and improved distribution, drying, and curing of curable conductive materials located in the wide structured micro-channels, forming wider structured micro-wires with lower electrical resistance. Such wider structured micro-wires can replace multiple electrically connected but spatially separated conventional micro-wires, saving space on a substrate without a corresponding reduction in conductivity.

Referring to FIG. 1, in an embodiment of the present invention, a micro-wire rib structure 5 includes a substrate 8 and a cured layer 10 with a cured-layer surface 11 formed on or over the substrate 8. A structured micro-channel 60 is imprinted in the cured layer 10. The structured micro-channel 60 has a micro-channel depth 68, a micro-channel bottom 65, first and second micro-channel sides 64, 66, and one or more ribs 20 having opposing rib sides and a rib top 26 defining a rib height 24 that is less than the micro-channel depth 68. Each rib 20 is located between the first and second micro-channel sides 64, 66 and extends from the micro-channel bottom 65 toward the cured-layer surface 11. According to further embodiments of the present invention, the rib 20 has a width 22 and is spaced apart from the first or second micro-channel side 64, 66 by a distance D. The structured micro-channel 60 (hereinafter referred to as micro-channel 60) has a micro-channel width 62.

A cured electrical conductor 32 forming a structured micro-wire 30 is located in the micro-channel 60. The structured micro-wire 30 (hereinafter referred to as micro-wire 30) extends continuously from the first micro-channel side 64, over the micro-channel bottom 65, the rib sides and the rib top 26 of the rib 20 to the second micro-channel side 66 forming a continuous electrical conductor 32 from the first micro-channel side 64 to the second micro-channel side 66.

According to various embodiments of the present invention, the substrate 8 is transparent, for example made of glass, or flexible, for example made of polymer. Cured layers 10 can include polymers with cross-linking materials that are cured with heat or radiation. A transparent substrate 8 can have a transparency to visible electromagnetic radiation greater than 50%, 60%, 70%, 80%, 90%, or 95%.

Figure 2:
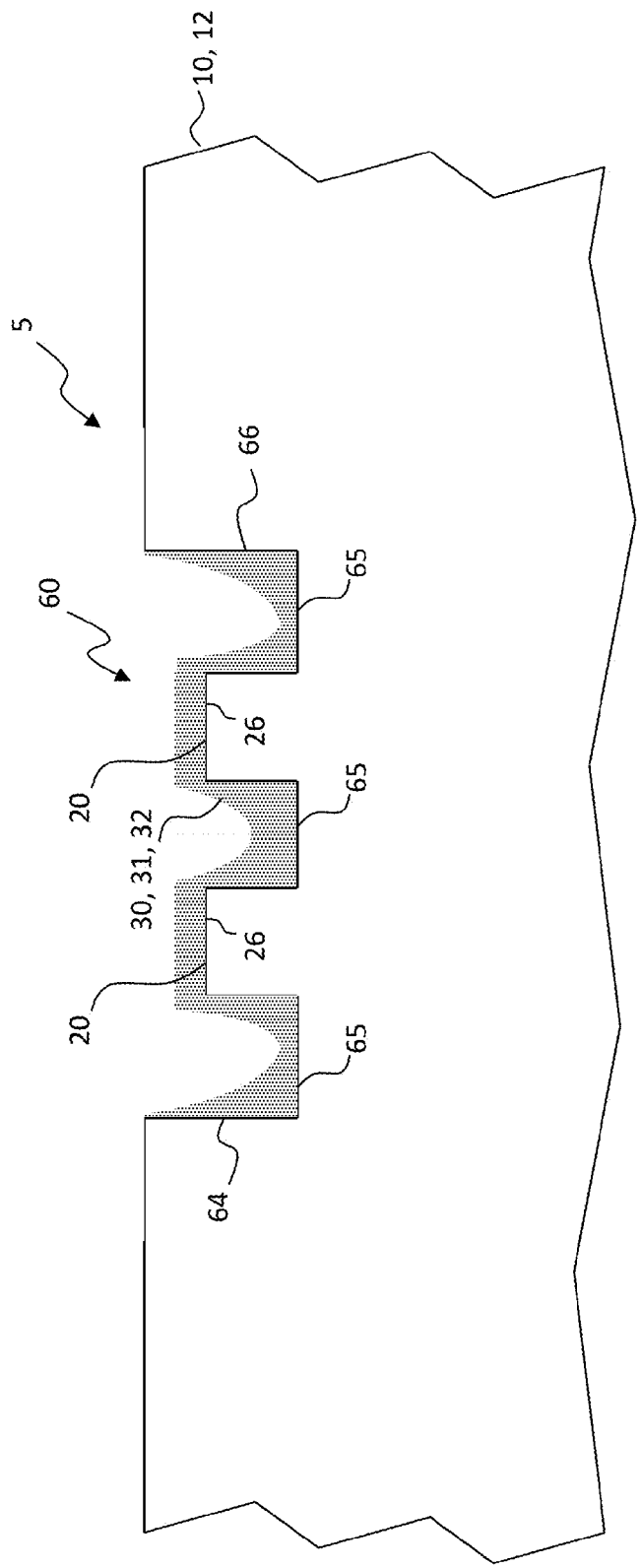
FIG. 2 is a cross-sectional view of another micro-wire rib structure having multiple ribs in an embodiment of the present invention.

As shown in FIG. 2 in an embodiment of the present invention, the micro-wire rib structure 5 has two ribs 20. The conductive material forming the micro-wires 30 is distributed across the micro-channel 60 from the first micro-channel side 64, across the micro-channel bottom 65, on both of the opposed rib sides of each rib 20, over the rib tops 26 of the ribs 20, to the second micro-channel side 66.

Figure 3:
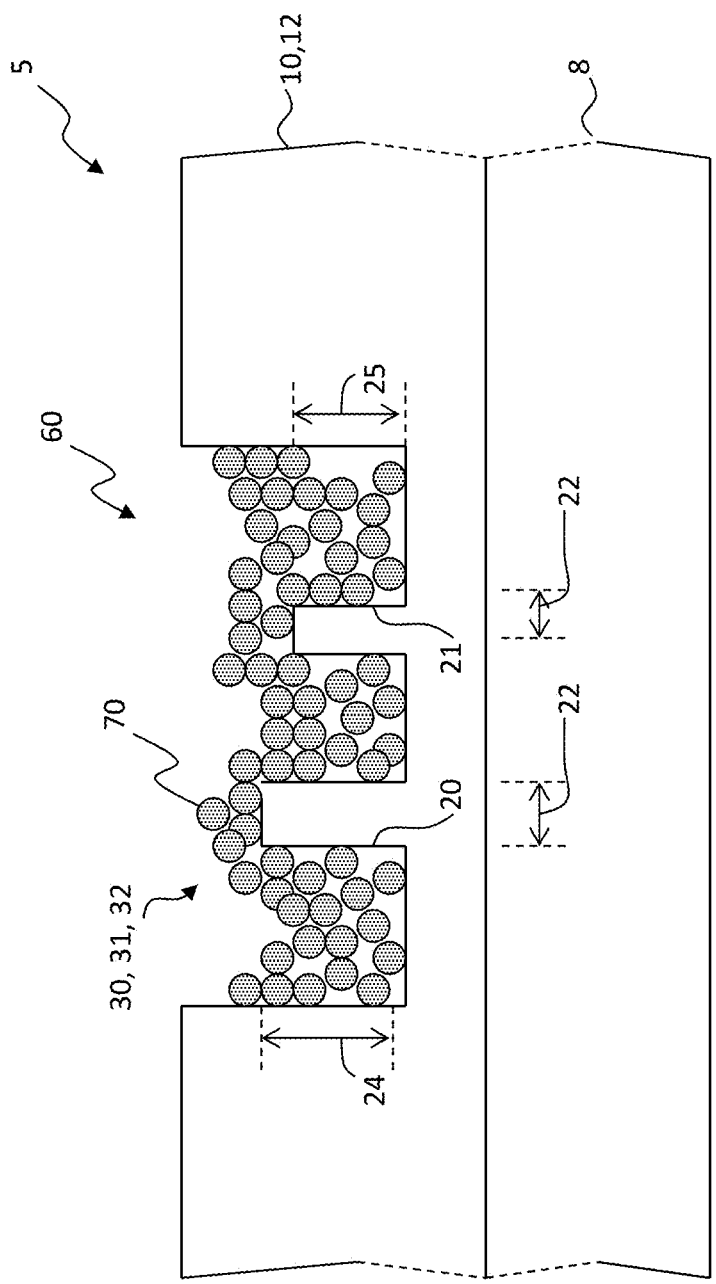
FIG. 3 is a cross-sectional view of another micro-wire rib structure having conductive nano-particles in an embodiment of the present invention.

Referring next to FIG. 3, in an embodiment of the present invention, the electrical conductor 32 of the micro-wire rib structure 5 includes sintered conductive nano-particles 70. These nano-particles 70 can be a metal, a metal alloy, or metal coated, for example include silver or copper. Liquid, curable conductive inks incorporating such nano-particles 70 are known in the art.

As shown in FIGS. 1 and 3 in various embodiments of the present invention, the micro-channel 60 includes first and second ribs 20, 21, the first rib 20 having a first rib height 24 and the second rib 21 having a second rib height 25 different than the first rib height 24. Each rib 20 has a rib width 22, the micro-channel 60 has a micro-channel width 62, and the rib width 22 is less than or equal to 50%, 25% 20%, or 10% of the micro-channel width 62. Alternatively or in addition, the first and second ribs 20, 21 have different rib widths 22.

In an embodiment, the rib height 24 is greater than or equal to one half of the micro-channel depth 68. In another embodiment, the micro-channel 60 has a micro-channel width 62 greater than or equal to 20 microns, greater than or equal to 10 microns, or greater than or equal to 5 microns. The micro-channel 60 is formed in the cured layer 10 on or over the substrate 8.

In yet another embodiment, the distance D between the first micro-channel side 62 and the nearest side of the rib 20 is less than 20 microns, less than 10 microns, or less than 5 microns. The micro-channel 60 can have a depth equal to or less than one micron, two microns, five microns, ten microns, twenty microns, or fifty microns. In an embodiment the rib height 24 is less than the micro-channel depth 68 by two to ten microns. The micro-channel 60 can have a micro-channel width 62 equal to or less than one micron, two microns, five microns, ten microns, 20 microns, or 50 microns. The cured layer 10 can have a cured thickness of about four to twelve microns, or from two to twenty microns.

In an embodiment, the micro-channel bottom 65 is substantially parallel to the cured-layer surface 11, as shown in the figures. Alternatively, the micro-channel bottom 65 is not parallel to the cured-layer surface 11 (not shown).

Figure 4:
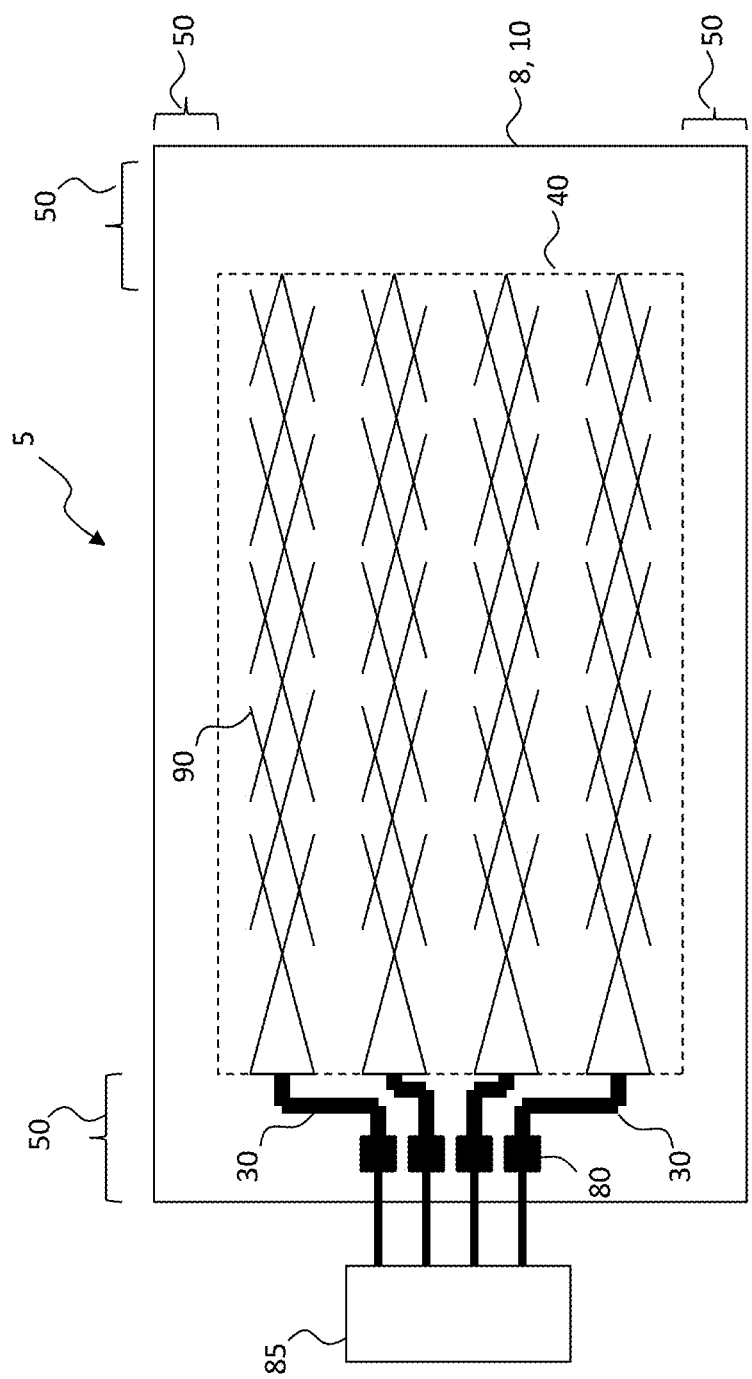
FIG. 4 is a plan view of a substrate with a display area and a peripheral area with micro-wire rib structures in an embodiment of the present invention.

As shown in FIG. 4 in an embodiment, the micro-wire rib structure 5 further includes electrodes 90 and connection pads 80 formed on or over the substrate 8. In an embodiment, the micro-wires 30, the electrodes 90, or the connection pads 80 are formed on or in the cured layer 10 in a common step or with common materials. Thus, in an embodiment conventional structures, for example the connection pads 80 and the micro-wires in the electrode 90 are formed in common steps with common materials as the micro-channels 60 and the micro-wires 30, for example using common imprinting steps with a common stamp, common deposition of liquid conductive inks, common removal of liquid conductive inks from the cured-layer surface 11, and common curing steps. The common stamp can form both structured micro-channels 60 and conventional micro-channels useful for electrode 90 or for connection pads 80. Alternatively, in an embodiment, the connection pads and electrodes 90 use structured micro-channels 60 and micro-wires 30 of the present invention.

The micro-wires 30 electrically connect the electrodes 90 to the connection pads 8. In yet another embodiment the electrode 90 includes multiple electrically connected conventional unstructured micro-wires formed in conventional unstructured micro-channels in the cured layer 10. In another embodiment the connection pad 80 is also formed in the cured layer 10 and can include electrically connected conventional unstructured micro-wires. In an embodiment, the micro-wire 30 is an electrical bus and has a greater conductivity than one of the conventional unstructured micro-wires of the electrode 90 and uses less area over the substrate than an equivalent portion of the electrode 90.

In a further embodiment and as illustrated in FIG. 4, the micro-wire rib structure 5 further includes a plurality of electrodes 90 and micro-wires 30 and a corresponding plurality of connection pads 80 formed over the substrate 8. A micro-wire 30 connects each of the electrodes 90 to a corresponding connection pad 80. The connection pads 80 can electrically connect to an external electrical element or component or an electrical element or component on, over, or affixed to the substrate 8 or the cured layer 10.

As shown in FIG. 4, the substrate 8 is transparent and has a display area 40 and a separate peripheral area 50. The electrodes 90 are located at least partly in the display area 40 and the micro-wires 30 are located in the peripheral area 50. The peripheral area 50 has a lower transparency than the display area 40. In an embodiment, the peripheral area 50 has a transparency less than or equal to 80%, 60%, 50%, 40%, 30%, 20%, or 10% in the visible range of electromagnetic radiation.

Figure 5:
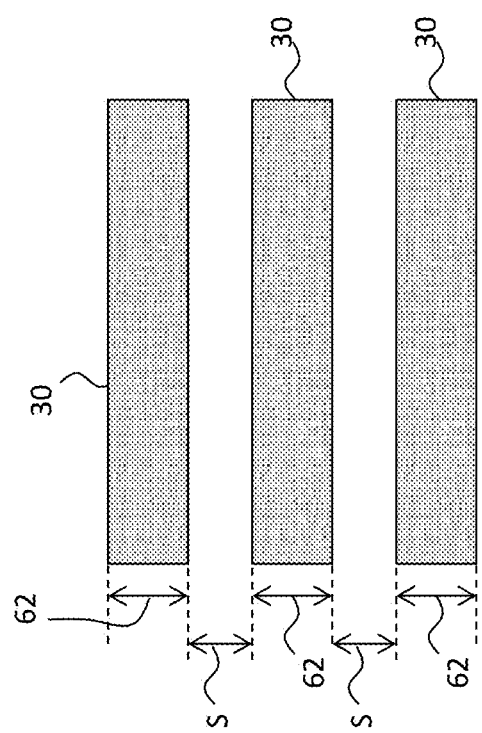
FIG. 5 is a plan view of three micro-wire rib structures in an embodiment of the present invention.

In another embodiment, referring to FIG. 5, each micro-wire 30 is separated from an adjacent micro-wire 30 by a distance less than or equal to 50 microns, 20 microns, or 10 microns. Alternatively or in addition, each micro-wire 30 is separated from an adjacent micro-wire 30 by a distance S less than or equal to the micro-channel width 62.

Because the micro-wires 30 of the present invention, in various embodiments, are wider and closer together than other conventional unstructured micro-wires, they more densely cover the substrate 8 and reduce the transparency of the substrate 8. Because the micro-wires 30 are located in the peripheral area 50 of the substrate 8, the reduction in transparency is not seen by a user of a display located in association with the display area 40. The transparency of an area is measured in an area that includes multiple micro-wires and can exclude areas that do not include micro-wires, for example the area between electrodes 90 in the display area 40 or the top, bottom, or right side of the cured layer 10 where no micro-wires 30 are present in the peripheral area 50 (FIG. 4).

Figure 6:
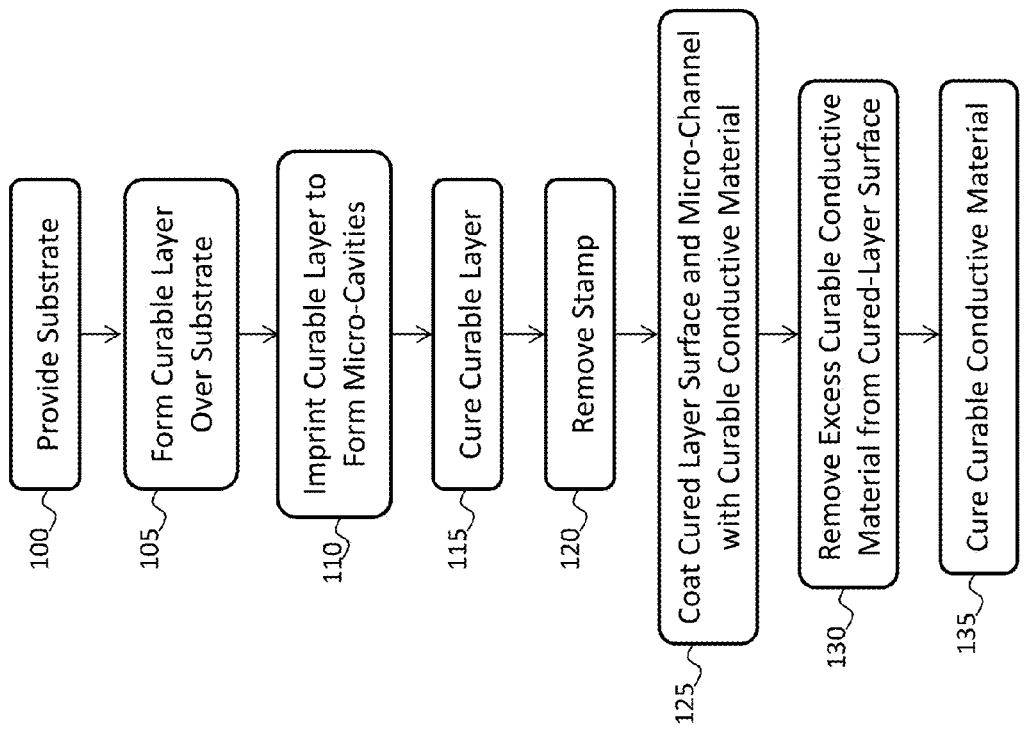
FIGS. 6-7 are flow diagrams illustrating various methods of the present invention.

Referring to FIG. 6 in a method of the present invention, the substrate 8 is provided in step 100 and a curable layer 12 formed over the substrate 8 in step 105, for example on or over the substrate 8 or on a layer on the substrate 8. The curable layer 12 is imprinted in step 110, for example with a stamp having protrusions that correspond to the micro-wire rib structures of the micro-channels 60 and define the first and second micro-channel sides 64, 66, the micro-channel bottom 65, and the rib(s) 20 in the micro-channel 60.

The curable layer 12 is cured in step 115 to form the cured layer 10 including the cured-layer surface 11 and the micro-channel 60 having the micro-channel depth 68, the micro-channel bottom 65, the first and second micro-channel sides 64, 66, and one or more ribs 20 having opposing rib sides and the rib top 26 with the rib height 24 less than the micro-channel depth 66. Each rib 20 is located between the first and second micro-channel sides 64, 66 and extends from the micro-channel bottom 65 toward the cured-layer surface 11. The stamp is removed in step 120.

A curable conductive material 31 is located in step 125 in the micro-channel 60. In an embodiment, the curable conductive material 31 is deposited in the micro-channels 60, for example by inkjet deposition. In another embodiment, the curable conductive material 31 is coated over the cured-layer surface 11 and the micro-channels 60. Excess curable conductive material 31 is removed from the cured-layer surface 11 but not from the micro-channels 60 in step 130. The curable conductive material 31 in the micro-channels 60 is cured in step 135, for example by heat, radiation or exposure to HCl or HCl vapor, to provide a cured electrical conductor 32 forming a micro-wire 30 in the micro-channel 60, the micro-wire 30 extending continuously from the first micro-channel side 64, over the micro-channel bottom 65, the rib side(s) and rib top(s) 26 of the ribs 20, to the second micro-channel side 66 forming the continuous electrical conductor 32 from the first micro-channel side 64 to the second micro-channel side 66.

In an embodiment, the curable layer 12 is formed on or over the substrate 8 by coating the substrate 8 using techniques known in the art, such as spin coating, curtain coating, or hopper coating. Alternatively, the curable layer 12 is laminated on or over the substrate 8 or layers on the substrate 8.

Figure 7:
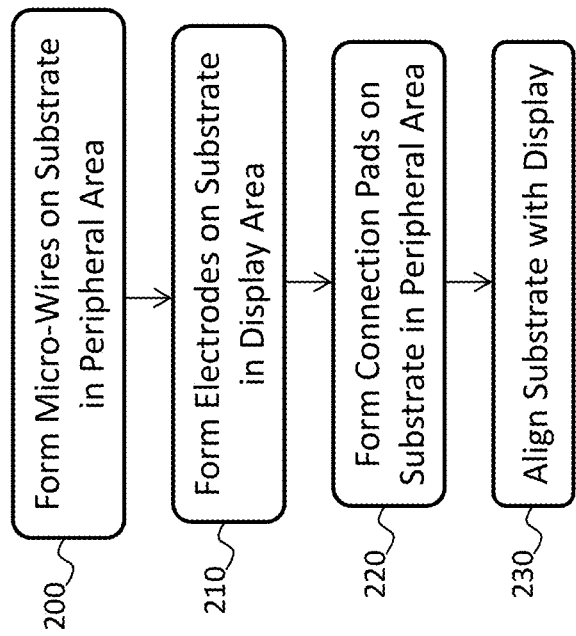

Referring to FIG. 7 and to FIG. 4 in another method, a plurality of micro-wires 30 are formed in micro-channels 60 in the peripheral area 50 of the substrate 8 in step 200, a plurality of electrodes 90 are formed in the display area 40 of the substrate 8 in step 210, and a corresponding plurality of connection pads 80 are formed in the peripheral area 50 of the substrate 8 in step 220. The micro-wire 30 connects each of the electrodes 90 to the corresponding connection pad 80. In an embodiment, the micro-wires 30, electrodes 90, and connection pads 80 are made at the same time with the same process steps and materials. Alternatively, they are made in any order and can use the same or different processes or materials, including photolithographic processes or screen printing. In another method, a display is aligned with the substrate 8 in step 230 so that pixels in the display emit, reflect, or transmit light through the display area 40 of the substrate 8.

As shown in FIG. 5, in an embodiment each micro-channel 60 is formed with a micro-channel width 62 and each micro-wire 30 is located separately from an adjacent micro-wire 30 by a distance less than or equal to the micro-channel width 62. In other embodiments, the substrate 8 provided in step 100 is transparent and has a display area 40 and a separate peripheral area 50. The electrodes 90 are located in step 210 at least partly in the display area 40 and the micro-wires 30 are located in step 200 in the peripheral area 50. The electrodes 90 and the micro-wires 30 are formed so that the peripheral area 50 has a lower transparency than the display area 40. For example, the micro-wires 30 in the peripheral area 50 are formed so that the peripheral area 50 has a transparency less than or equal to 80%, 60%, 50%, 40%, 30%, or 20%. In another embodiment, the micro-channels 60 are formed, for example by imprinting (step 110, FIG. 6) with a micro-channel width 62 greater than or equal to 20 microns or greater than or equal to 10 microns. In another embodiment, the ribs 20 are formed (step 110, FIG. 6) with a rib height 24 that is greater than or equal to one half of the micro-channel depth 68. Alternatively or in addition, the rib 20 is formed with a rib width 22 and the micro-channel 60 is formed with a micro-channel width 62 and the rib width 22 is less than or equal to 50%, 40%, 30%, 20%, 10%, or 5% of the micro-channel width 62.

Referring back to FIG. 2 and with reference to steps 125 and 130 of FIG. 6, the increased surface area provided by the rib(s) 20 within the micro-channel 60 wicks the curable, liquid conductive material 31 over the various surfaces in the micro-channel 60 to improve distribution of the curable, liquid conductive material 31 in the micro-channel 60 (step 125). At the same time, the ribs 20 prevent a wiper from reaching too far toward the micro-channel bottom 65 and excavating the curable, liquid conductive material 31 from the micro-channel 65 (step 130). Even if curable conductive material 31 is removed from the rib tops 26 by wiping, the liquid, curable conductive material 31 can move back over the rib tops 26 after the wiper is removed to provide an electrical conductor 32 that extends from the first micro-channel side 64 to the second micro-channel side 66. In an embodiment, the coating, wiping, and curing steps 125, 130, 135 of curable conductive material 31 are repeated.

In operation, referring back to FIG. 4, a device of the present invention is controlled by a controller 85 connected to the connection pads 80 in the peripheral area 50. The controller 85 provides electrical signals that are electrically conducted through the micro-wires 30 to the electrodes 90. Likewise, electrical signals from the electrodes 90 are conducted through the micro-wires 30 and the connection pads 80 to the controller 85. The micro-wires 30 have a higher conductivity than the electrodes 90 to reduce the signal-to-noise ratio of any signals conducted from the electrodes 90 to the controller 85 and a smaller size than multiple conventional unstructured micro-wires to reduce the size of the peripheral area 50 and relatively increase the size of the display area 40, thereby reducing the overall area required by the substrate 8 in combination with a display.

In an embodiment, the controller 85 is external to the substrate 8; in another embodiment the controller 85 is affixed to or formed over the substrate 8 or cured layer 10. In further embodiments, two cured layers 10 having micro-wires 30 and electrodes 90 are formed over or on either side of the substrate 8. The electrodes 90 in each layer extend orthogonally to the electrodes 90 in the other layer. In a useful application, the electrodes 90 form capacitors that are controlled to detect changes in capacitance from nearby conductors such as fingers, forming a capacitive touch screen. In useful embodiment, the substrate 8 is a dielectric and the cured layers 10 are formed on opposing sides of the substrate 8. Alternatively, the two cured layers 10 are formed on a common side of the substrate 8 but are electrically isolated by one of the cured layers 10. The cured layers 10 can be dielectric layers.

Additive imprinting processes are known to form small features such as micro-channels 60 in cured layers 10 at a relatively high rate compatible with inexpensive roll-to-roll processes with less waste than other processes such as photolithographic processes. Structures within the imprinted micro-channels 60 improve the distribution and quantity of curable conductive material 31, such as conductive inks, within the micro-channels 60.

Most electrical substrates or printed circuit boards have connection pads to provide electrical connections to components on the substrate. Electrical buses conduct large currents to the components. For substrates used with displays, such as touch screen substrates, as noted above it is important to maintain transparency for areas in which the displays emit, reflect, or transmit light. In order to provide electrical connections, buses, and electrodes, the prior art typically employs screen printing with low-resolution and relatively large features, or expensive high-resolution photo-lithographic processes. The present invention provides a low-cost method of forming conductive micro-wire structures over a substrate with improved conductivity and reduced size.

The micro-channels 60 can have any useful shape, regular or irregular, for example rectangular, polygonal, or with curved edges. The micro-channels 60 can form long, narrow structures. In applications with multiple micro-channels 60, the micro-channels 60 can have different sizes, shapes, areas, lengths, or widths as can the ribs 20 and the micro-wires 30 formed in the micro-channels 60. The micro-wires 30 can be formed from common materials.

As will be familiar to those skilled in the photo-lithographic arts, the terms over and on are relative terms and by a change in perspective are considered below or under. The cured layer 10 is considered to be on or over the substrate 8 but can equally well be considered under or below the substrate 8 by reversing the positions of the cured layer 10 and the substrate 8. The present invention is not limited by the relative locations of the cured layer 10 and the substrate 8.

According to various embodiments of the present invention, the substrate 8 is any material having a substrate surface on which the first curable layer 12 can be formed. In an embodiment, the substrate 8 is transparent, flexible, or rigid and has a substantially planar surface. Glass or plastic can both be used. The substrate 8 can have a wide variety of thicknesses, for example 10 microns, 50 microns, 100 microns, 1 mm, or more. The substrate 8 can be an insulating dielectric material. In another embodiment, the substrate 8 is a component of a display, such as a display substrate or display cover of an LCD or OLED display. In an embodiment, the substrate 8 is large enough for a user to directly interact therewith, for example using an implement such as a stylus or using a finger or hand.

Material compositions useful in the curable layer 12 or the curable conductive material 31 can be provided in one state and then processed into another state, for example converted from a liquid state into a solid state, to cure it. Such conversion can be accomplished in a variety of ways, for example by drying, heating, or exposure to radiation. As used herein, any processing of the curable layer 12 into the imprinted cured layer 10 is considered to be curing. Similarly, drying, heating, radiating, sintering, welding, or soldering of the curable conductive material 31 is also curing and as also used herein any processing of the curable conductive material 31 into the cured electrical conductor 32 and micro-wire 30 is considered to be curing. Furthermore, useful material compositions can include a set of materials that, after deposition and processing, is reduced to a subset of the set of materials, for example by removing solvents from the material composition. For example, a material composition including a solvent is deposited and then processed to remove the solvent leaving a material composition without the solvent in place. Thus, according to embodiments of the present invention, a material composition that is deposited on a layer or in the imprinted micro-channels 60 is not necessarily the same composition as that found in the cured material composition.

The cured layer 10 is a layer of non-conductive curable material that has been cured. For example, the cured layer 10 is formed of a non-conductive curable material coated or otherwise deposited on a surface of the substrate 8 to form the curable layer 12 and then cured to form the non-conductive cured layer 10. The substrate-coated non-conductive curable material is considered herein to be the curable layer 12 before it is cured and the cured layer 10 after it is cured. Similarly, the cured electrical conductor 32 is an electrical conductor 32 formed by locating curable conductive material 31 in the micro-channel 60 and curing the curable conductive material 31 to form the cured electrical conductor 32 in the micro-channel 60. The cured electrical conductor 32 is a micro-wire 30. In FIGS. 1, 2, and 3, the curable layer 12 and cured layer 10 are indicated with same drawing element, since they represent the same element at different stages of construction. Similarly, curable conductive material 31, the electrical conductor 32, and the micro-wire 30 are indicated with the same drawing element, since they represent the same element at different stages of construction.

In an embodiment, the non-conductive cured layer 10 is a layer that is imprinted in a single step and cured in a single step. In another embodiment, the imprinting step and the curing step are different single steps. For example, the curable layer 12 is imprinted in a first step using a stamping method known in the art and cured in a second different step, e.g. by heat or exposure to radiation. In another embodiment, imprinting and curing the curable layer 12 is done in a single common step. The curable layer 12 can be deposited as a single layer in a single step using coating methods known in the art, e.g. curtain coating. In an alternative embodiment, the curable layer 12 can be deposited as multiple sub-layers in a single step using multi-layer deposition methods known in the art, e.g. multi-layer slot coating, repeated curtain coatings, or multi-layer extrusion coating. In yet another embodiment, the curable layer 12 includes multiple sub-layers formed in different, separate steps, for example with a multi-layer extrusion, curtain coating, or slot coating machine as is known in the coating arts. The micro-channel 60 is embossed and cured in the curable layer 12 in a single step to form the imprinted cured layer 10 and the micro-wires 30 are formed by depositing a curable conductive material 31 in the micro-channels 60 and curing the curable conductive material 31 to form an electrically conductive micro-wire 30. The conductive material 31 can be an ink, a conductive ink, or a non-conductive ink that is conductive when cured.

The non-conductive cured layer 10 useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. When a molding device, such as an imprinting stamp having an inverse micro-channel structure is applied to liquid curable material in the curable layer 12 coated on the substrate 8 and the cross-linking agents in the curable material are activated, the liquid curable material in the curable layer 12 is hardened into the cured layer 10 having the micro-channels 60. The liquid curable materials can include a surfactant to assist in controlling coating on the substrate 8. Materials, tools, and methods are known for embossing coated liquid curable materials to form the cured layers 10 having conventional single-layer micro-channels.

In various embodiments useful in the present invention, cured inks can include metal particles, for example the nano-particles 70 or particles with an electrically conductive shell, for example a metallic shell. The particles can be sintered to form a metallic electrical conductor. The metal nano-particles 70 can be silver or a silver alloy or other metals or metal alloys, such as or including tin, tantalum, titanium, gold, copper, or aluminum, or alloys thereof. Cured inks can include light-absorbing materials such as carbon black, a dye, or a pigment.

In another embodiment, curable inks provided in a liquid form are deposited or located in micro-channels 60 and cured, for example by heating or exposure to radiation such as infra-red, visible light, or ultra-violet radiation. The curable ink hardens to form the cured ink that makes up micro-wires 30. For example, a curable conductive ink with the conductive nano-particles 70 are located within the micro-channels 60 and heated to agglomerate or sinter the nano-particles, thereby forming an electrically conductive micro-wire 30. Materials, tools, and methods are known for coating liquid curable inks to form micro-wires in conventional unstructured micro-channels and are useful with the present invention.

In yet another embodiment, a curable ink can include conductive nano-particles (e.g. 70) in a liquid carrier (for example an aqueous solution including surfactants that reduce flocculation of metal particles, humectants, thickeners, adhesives or other active chemicals). The liquid carrier can be located in the micro-channels 60 and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive. In any of these cases, conductive inks or other conducting materials need only be conductive after they are cured and any needed processing completed. Conductive inks are known in the art and are commercially available. Deposited materials are not necessarily electrically conductive before patterning or before curing. As used herein, a conductive ink is a material that is electrically conductive after any final processing is completed and the conductive ink is not necessarily conductive at any other point in the micro-wire 30 formation process.

The micro-wires 30 can be metal, for example silver, gold, aluminum, nickel, tungsten, titanium, tin, or copper or various metal alloys including, for example silver, gold, aluminum, nickel, tungsten, titanium, tin, or copper. The micro-wires 30 can include a thin metal layer composed of highly conductive metals such as gold, silver, copper, or aluminum. Other conductive metals or materials can be used. Alternatively, the micro-wires 30 can include cured or sintered metal particles such as nickel, tungsten, silver, gold, titanium, or tin or alloys such as nickel, tungsten, silver, gold, titanium, or tin. Conductive inks can be used to form the micro-wires 30 with pattern-wise deposition or pattern-wise formation followed by curing steps. Other materials or methods for forming the micro-wires 30, such as curable ink powders including metallic nano-particles, can be employed and are included in the present invention.

An imprinting stamp having portions that protrude by different amounts to form the micro-channel 60, micro-channel bottom 65, and ribs 20 can be made through repeated exposures through a stack of ordered masks. For example a transparent stamp substrate is provided and coated with first stamp curable layer and exposed through a first mask with a first pattern, for example a flat stamp structure corresponding to the micro-channel floor 65. The first stamp curable layer is cured, for example with radiation. A second stamp curable layer is coated over the cured first stamp curable layer and exposed through a second mask with a second pattern having exposed portions that are a subset of the first mask, for example stamp structures corresponding to the ribs 20 and the first and second micro-channel side walls 64, 66. The second stamp curable layer is cured, for example with radiation. A third stamp curable layer is coated over the cured second and first stamp curable layers and exposed through a third mask with a third pattern having exposed portions that are a subset of the second mask, for example stamp structures corresponding to the first and second micro-channel side walls 64, 66. The third stamp curable layer is cured, for example with radiation. The formed imprinting multi-level stamp can then be used for imprinting cured layers 10 as described above.

Methods and device for forming and providing substrates, coating substrates and other layers, patterning coated substrates or layers, or pattern-wise depositing materials on a substrate or layer are known in the photo-lithographic and coating arts. Hardware controllers for controlling displays and touch screens and software for managing display systems are all well known. All of these tools and methods are usefully employable to design, implement, construct, and operate the present invention. Methods, tools, and devices for operating displays and touch screens can be used with the present invention.

The present invention is useful in a wide variety of electronic devices. Such devices can include, for example, photovoltaic devices, OLED displays and lighting, LCD displays, inorganic LED displays and lighting, electrophoretic displays, and electrowetting displays.

The invention has been described in detail with particular reference to certain embodiments thereof, but it will be understood that variations and modifications can be effected within the spirit and scope of the invention.

PARTS LIST

D distance
S separation 5 imprinted micro-wire rib structure
8 substrate
10 cured layer
11 cured-layer surface
12 curable layer
20 rib/first rib
21 second rib
22 rib width
24 rib height/first rib height
25 second rib height
26 rib top
30 micro-wire
31 conductive material
32 electrical conductor
40 display area
50 peripheral area
60 micro-channel
62 micro-channel width
64 first micro-channel side
65 micro-channel bottom
66 second micro-channel side
68 micro-channel depth
70 nano-particle
80 connection pad
85 controller
90 electrode
100 provide substrate step
105 form curable layer over surface step
110 stamp curable layer to form micro-channels step
115 cure curable layer step
120 remove stamp step
125 coat cured layer surface and micro-channels with curable material step
130 remove excess curable material from cured layer surface step
135 cure curable material step
200 form micro-wires on substrate in peripheral area step
210 form electrodes on substrate in display area step
220 form connection pads on substrate in peripheral area step
230 align substrate with display step

The invention claimed is:

1. A micro-wire rib structure, comprising:
a substrate;
a cured layer formed on or over the substrate, the cured layer having a cured-layer surface;
a micro-channel imprinted in the cured layer, the micro-channel having a micro-channel depth, a micro-channel bottom, first and second micro-channel sides, and one or more ribs having opposing rib sides and a rib top defining a rib height less than the micro-channel depth, each rib located between the first and second micro-channel sides and extending from the micro-channel bottom toward the cured-layer surface;
a cured electrical conductor forming a micro-wire in the micro-channel, the micro-wire extending continuously from the first micro-channel side, over the micro-channel bottom, the rib side(s) and rib top(s), to the second micro-channel side forming a continuous electrical conductor from the first micro-channel side to the second micro-channel side.

2. The micro-wire rib structure of claim 1, wherein the cured electrical conductor includes sintered conductive nano-particles.

3. The micro-wire rib structure of claim 1, wherein the micro-channel includes first and second ribs, the first rib having a first height and the second rib having a second height different from the first height.

4. The micro-wire rib structure of claim 1, wherein the rib has a rib width and the micro-channel has a micro-channel width and the rib width is less than or equal to 20% of the micro-channel width.

5. The micro-wire rib structure of claim 1, wherein the micro-channel includes first and second ribs, the first rib having a first width and the second rib having a second width different from the first width.

6. The micro-wire rib structure of claim 1, wherein the rib height s greater than or equal to one half of the micro-channel depth.

7. The micro-wire rib structure of claim 1, wherein themicro-channel has a micro-channel width greater than or equal to 20 microns.

8. The micro-wire rib structure of claim 1, wherein the micro-channel has a micro-channel width greater than or equal to 10 microns.

9. The micro-wire rib structure of claim 1, wherein the micro-channel has a micro-channel width greater than or equal to 5 microns.

10. The micro-wire rib structure of claim 1, wherein the distance between the first micro-channel side and the nearest rib side is less than 20 microns.

11. The micro-wire rib structure of claim 1, wherein the distance between the first micro-channel side and the nearest rib side is less than 10 microns.

12. The micro-wire rib structure of claim 1, wherein the distance between the first micro-channel side and the nearest rib side is less than 5 microns.

13. The micro-wire rib structure of claim 1, further including an electrode and a connection pad formed over the substrate, and wherein the micro-wire electrically connects the electrode and the connection pad.

14. The micro-wire rib structure of claim 13, wherein the micro-wire is a bus.

15. The micro-wire rib structure of claim 13, further including a plurality of electrodes and micro-wires and a corresponding plurality of connection pads formed over the substrate, a micro-wire connecting each of the electrodes to a corresponding connection pad.

16. The micro-wire rib structure of claim 15, wherein each micro-wire is separated from an adjacent micro-wire by a distance less than or equal to 50 microns.

17. The micro-wire rib structure of claim 15, wherein each micro-channel has a width and each micro-wire is separated from an adjacent micro-wire by a distance less than or equal to the width of the micro-channel.

18. The micro-wire rib structure of claim 15, wherein the substrate is transparent and has a display area and a separate peripheral area and wherein the electrodes are located at least partly in the display area and the micro-wires are located in the peripheral area, and wherein the peripheral area has a lower transparency than the display area.

19. The micro-wire rib structure of claim 15, wherein the peripheral area has a transparency less than or equal to 80%.

* * * * *